(12) United States Patent
Takahashi et al.

(10) Patent No.: US 8,450,858 B2
(45) Date of Patent: May 28, 2013

(54) METHOD OF MANUFACTURING SEMICONDUCTOR DEVICE INCLUDING WIRING LAYOUT AND SEMICONDUCTOR DEVICE

(75) Inventors: Takuya Takahashi, Kato (JP); Fumihiro Fuchino, Kakogawa (JP); Yuuichi Kohno, Sanda (JP); Masanori Miyata, Akashi (JP)

(73) Assignee: Ricoh Company, Ltd., Tokyo (JP)

( * ) Notice: Subject to any disclaimer, the term of this patent is extended or adjusted under 35 U.S.C. 154(b) by 375 days.

(21) Appl. No.: 12/771,067

(22) Filed: Apr. 30, 2010

(65) Prior Publication Data

US 2010/0295184 A1    Nov. 25, 2010

(30) Foreign Application Priority Data

May 19, 2009    (JP) .................... 2009-121473

(51) Int. Cl.
*H01L 23/48*    (2006.01)
*H01L 23/52*    (2006.01)

(52) U.S. Cl.
USPC .............. 257/776; 257/758; 257/E23.019

(58) Field of Classification Search
USPC .............. 257/758, 776, E23.019
See application file for complete search history.

(56) References Cited

U.S. PATENT DOCUMENTS

| | | | | |
|---|---|---|---|---|
| 5,886,415 | A * | 3/1999 | Akagawa | 257/789 |
| 6,841,875 | B2 * | 1/2005 | Ohsumi | 257/738 |
| 7,807,512 | B2 * | 10/2010 | Lee et al. | 438/127 |
| 8,080,880 | B2 * | 12/2011 | Brunnbauer et al. | 257/773 |
| 8,198,729 | B2 * | 6/2012 | Chou et al. | 257/758 |
| 2009/0079095 | A1 | 3/2009 | Miyata et al. | |
| 2009/0156001 | A1 * | 6/2009 | Hsu et al. | 438/667 |
| 2009/0170323 | A1 | 7/2009 | Miyata et al. | |

FOREIGN PATENT DOCUMENTS

| JP | 9-199587 | 7/1997 |
|---|---|---|
| JP | 2003-109957 | 4/2003 |

* cited by examiner

*Primary Examiner* — Nitin Parekh
(74) *Attorney, Agent, or Firm* — Cooper & Dunham LLP

(57) ABSTRACT

A method of manufacturing a semiconductor device having a first wiring layer, a first interlayer insulating film, a second interlayer insulating film, a third interlayer insulating film, and a second wiring layer, in which the method includes depositing the second wiring layer on the third interlayer insulating film and, where the widths of first wiring layer and the second wiring layer are 10.0 μm or greater, executing one of etching the second wiring layer to set a width of 1.0 μm or greater in a portion where the first wiring layer and the second wiring layer overlap and etching the second wiring layer to set a horizontal distance of 2.0 μm or greater between adjacent portions of the first wiring layer and the second wiring layer.

4 Claims, 4 Drawing Sheets

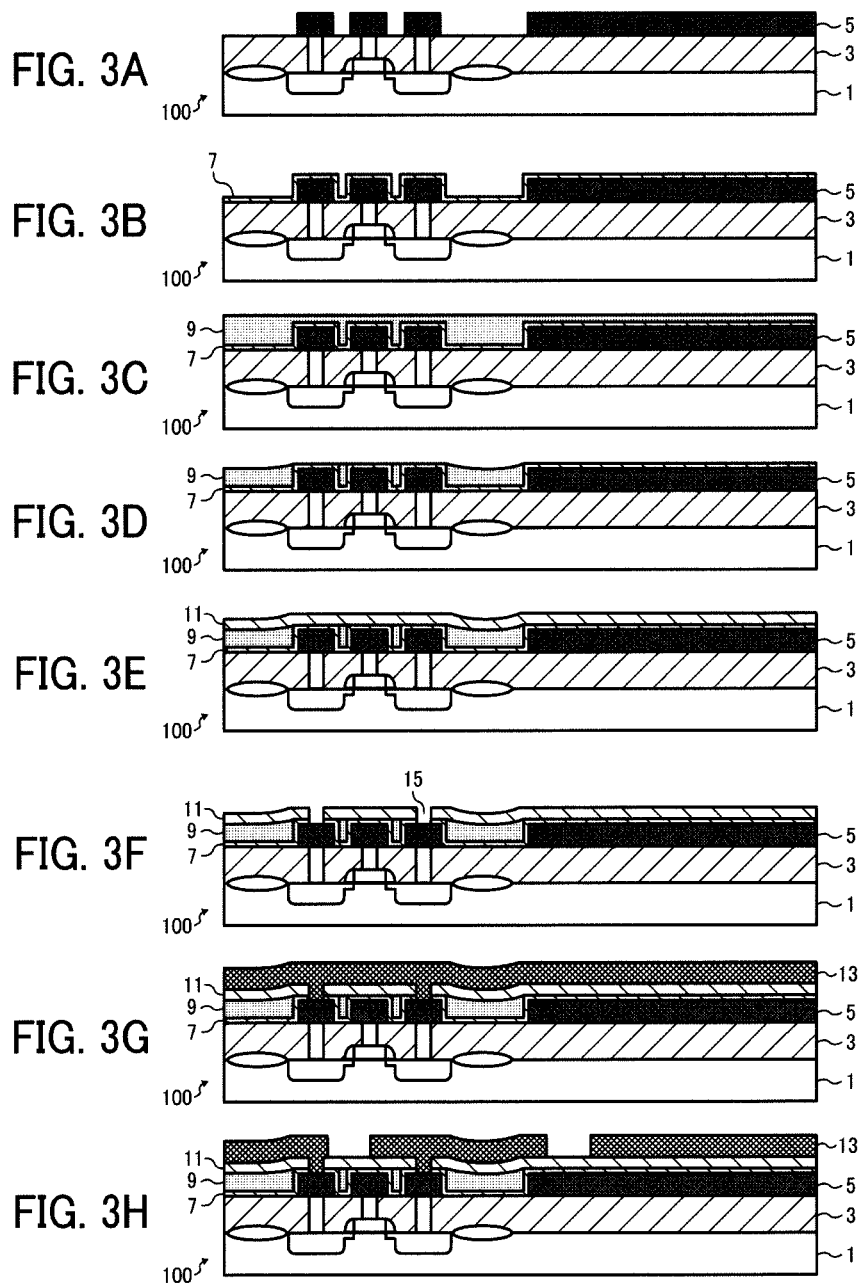

METHOD OF MANUFACTURING SEMICONDUCTOR DEVICE INCLUDING WIRING LAYOUT AND SEMICONDUCTOR DEVICE

CROSS-REFERENCE TO RELATED APPLICATIONS

This patent specification claims priority from Japanese Patent Application No. 2009-121473, filed on May 19, 2009 in the Japan Patent Office, which is hereby incorporated by reference herein in its entirety.

BACKGROUND OF THE INVENTION

1. Field of the Invention

The present invention relates to a method of manufacturing a semiconductor device including wiring layout and a semiconductor device including wiring layers.

2. Discussion of the Background

In general, semiconductor devices include wiring layers and insulating films disposed between the wiring layers. These days, as the semiconductor devices are manufactured in micro-fabrication dimension, there is market demand for flattening the insulating films between the wiring layers.

As for the method of flattening the insulating films between the wiring layers, for example, a spin-coating method and an etch-back method are used. Herein, films formed through the spin-coating and the etch-back processes are called spin-on glass (SOG) films. Because mechanical strength of the SOG film is relatively low and the SOG film tends to absorb moisture resulting in reliability failures, an additional insulating film is usually formed on the SOG film.

Compared with insulating films formed by plasma chemical vapor deposition (plasma CVD), a drawback of SOG films is that they have poor mechanical strength and cracks can be easily generated by heat stress applied to the SOG film during manufacturing or while the semiconductor device is in use. It is known that cracks generated during manufacturing seriously affect the reliability of the semiconductor device.

Turning now to FIGS. 5, 6A and 6B, failure of interlayer insulating films including a SOG film in a semiconductor device 1000 is described below. FIG. 5 is an electron micrograph of a cross section of the semiconductor device 1000. FIG. 6A is a schematic view of the cross section of the semiconductor device 1000 shown in FIG. 5. FIG. 6B is a plan view illustrating a layout of wiring layers 50 and 130 in the semiconductor device 1000 shown in FIGS. 5 and 6A.

With reference to FIG. 5, when the first wiring layer 50 and the second wiring layer 130 have large areas, stress is generated in directions indicated by white arrows shown in FIG. 6A during a subsequent heating process due to a difference in coefficient of thermal expansion between the material of the wiring layers and the material of the interlayer insulating films. Then, due to the heat stress, a crack 17 is generated in interlayer insulating films 70 and 90 located beneath the second wiring layer 130.

In order to prevent this failure, several approaches are proposed. As one example, JP-H09-199587-A proposes that slits are formed in a wiring layer that has a relatively large area (wide).

However, although the wiring layer is designed to have a large area such that great current can flow, a cross-sectional area of the wiring layer through which the current flows is decreased by the slits, and thus the amount of the current flowing through the wiring layer may be decreased as well.

As another example, JP-2003-109957-A proposes etching a lower wiring layer such that a ratio of a line width to an interval between the lines remains a specified ratio.

However, because specifying the ratio of line width to interval between the lines in the lower wiring layers can impose stricter limitations on the layout of the wiring layers than minimum processing dimensions, and therefore, a horizontal size of the semiconductor may become large, which is a problem.

In view of the foregoing, there is market demand for a semiconductor device and a layout of wiring layers in the semiconductor device to prevent cracks in the interlayer insulating films including the SOG film without forming slits in the wiring layer or specifying the ratio of the line width to the intervals between the lines in the lower wiring layer.

SUMMARY

In view of the foregoing, one illustrative embodiment of the present invention provides a method of manufacturing a semiconductor device that includes forming a first wiring layer on a portion of an underlying insulating film, forming a first interlayer insulating film on the underlying insulating film and the first wiring layer, depositing a second interlayer insulating film through spin-coating, etching the second interlayer insulating film through an etch-back process, forming a third interlayer insulating film on the first interlayer insulating film and the second interlayer insulating film, depositing a second wiring layer on the third interlayer insulating film, and, where the widths of first wiring layer and the second wiring layer are 10.0 μm or greater, executing one of etching the second wiring layer to set a width of 1.0 μm or greater in a portion where the first wiring layer and the second wiring layer overlap and etching the second wiring layer to set a horizontal distance of 2.0 μm or greater between adjacent portions of the first wiring layer and the second wiring layer.

Another illustrative embodiment of the present invention provides a semiconductor device that includes an underlying insulating film, a first wiring layer, a first interlayer insulating film, a second interlayer insulating film, a third interlayer insulating film, and a second wiring layer. The first wiring layer is formed on the underlying insulating film. The first interlayer insulating film is formed on the underlying insulating film and the first wiring layer. The second interlayer insulating film is formed through by rotation coating or an etch-back process on the first interlayer insulating film. The third interlayer insulating film is formed on the first interlayer insulating film and the second interlayer insulating film. Where the widths of the first wiring layer and the second wiring layer are 10.0 μm or greater, either the second wiring layer is formed on the third interlayer insulating film to overlap the first wiring layer and the overlapping portion is at least 1.0 μm or the second wiring layer is formed at a horizontal distance at least 2.0 μm from the first wiring layer.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 3A through 3H are steps in manufacturing the multiple wiring layers and films of the semiconductor device shown in FIG. 1A or FIG. 2A;

DETAILED DESCRIPTION OF PREFERRED EMBODIMENTS

Figure 1A:
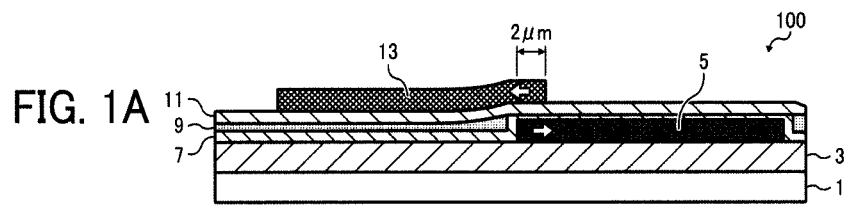
FIG. 1A is a schematic cross-sectional view illustrating positions of wiring layers of a semiconductor device according to one illustrative embodiment.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve a similar result.

Referring now to the drawings, wherein like reference numerals designate identical or corresponding parts throughout the several views thereof, particularly to FIGS. 1A and 1B, a layout of wiring layers (wiring patterns) of a semiconductor device according to an illustrative embodiment of the present invention is described below.

FIG. 1A is a schematic cross-sectional view illustrating positions of wiring layers of a semiconductor device 100 according to a first embodiment. FIG. 1B is a plan view illustrating a layout of wiring layers 5 and 13 in the semiconductor device 100 shown in FIG. 1A.

The semiconductor device 100 includes a semiconductor substrate 1, an underlying insulating film 3, a first wiring layer 5, a first interlayer insulating film 7, a second interlayer insulating film 9, a third interlayer insulating film 11, and a second wiring layer 13.

As shown in FIG. 1A, the underlying insulating film 3, which serves as an underlying insulating layer for the wiring layers, is formed on the semiconductor substrate 1 on which elements are formed. The first wiring layer 5 (first wide wiring layer) is formed on the underlying insulating film 3. The width of the first wiring layer 5 is 10.0 μm, for example, in the portion shown in FIG. 1B.

The first interlayer insulating film 7 is formed on the underlying insulating film 3 and the first wiring layer 5.

The second interlayer insulating film 9, which is a spin-on glass (SOG) film (hereinafter "SOG film"), is formed through spin-coating and an etch-back process on a portion of the first interlayer insulating film 7 to eliminate or reduce steps in the first interlayer insulating film 7 in portions where the height of the first interlayer insulating film 7 is reduced (concavities) due to the absence of the first wiring layer 5 below.

The third interlayer insulating film 11 is formed on the first interlayer insulating film 7 and the SOG film 9.

The second wiring layer 13 (second wide wiring layer) is formed on the third interlayer insulating film 11. The width of the second wiring layer 13 is 10.0 μm, for example, in the portion shown in FIG. 1B. In the configuration shown in FIG. 1B, when viewed from above, the second wiring layer 13 is placed so as to overlap partially the first wiring layer 5. The width of the overlapping portion is 1.0 μm or greater, for example, 2.0 μm.

Although the first wiring layer 5 and the second wiring layer 13 are also formed in other areas that are not shown in the figures, in this embodiment, relative positions of the second wiring layer 13 to the first wiring layer 5 are not specified where the widths of the first wiring layer 5 and the second wiring layer 13 are less than 10.0 μm.

Figure 1B:
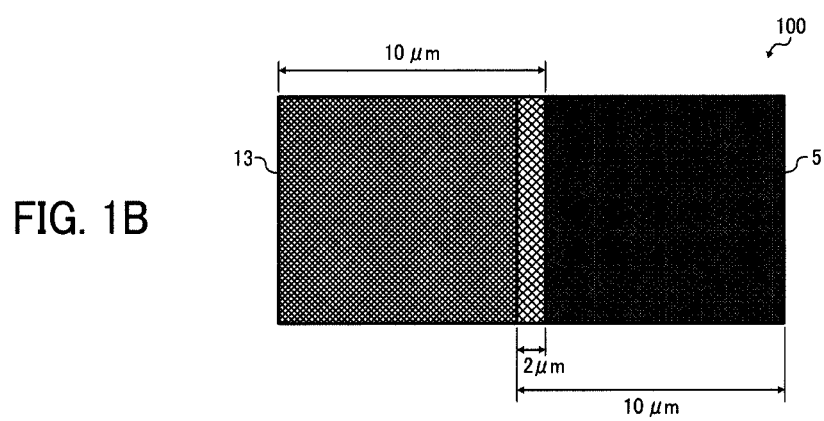
FIG. 1B is a plan view illustrating a layout of wiring layers in the semiconductor device shown in FIG. 1A.

By contrast, with reference to FIGS. 1A and 1B, where the widths of the first wiring layer 5 and the second wiring layer 13 are 10.0 μm or greater, the second wiring layer 13 overlaps the first wiring layer 5. The width of overlapping portion is 1.0 μm or greater, for example, 2.0 μm.

With the above-described layout, therefore, even when stress is generated in directions indicated by white arrows shown in FIG. 1A during manufacturing or while the semiconductor device 100 is in use, heat stress exerted on the SOG film 9 located beneath the second wide wiring layer 13 can be reduced. Accordingly, cracks in the interlayer insulating films including the first interlayer insulating film 7, the SOG film 9, and the third interlayer insulating film 11 can be prevented.

Figure 2A:
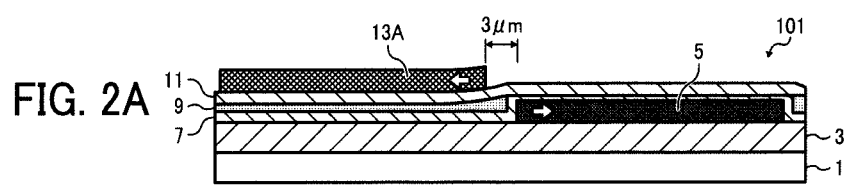
FIG. 2A is a schematic cross-sectional view illustrating positions of wiring layers of a semiconductor device according to another illustrative embodiment.
Figure 2B:
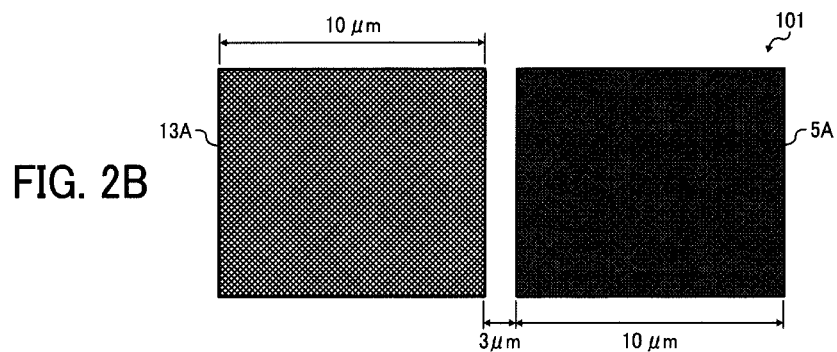
FIG. 2B is a plan view illustrating a layout of wiring layers in the semiconductor device shown in FIG. 2A.

FIG. 2A is a schematic cross section view illustrating a layout of wiring layers of a semiconductor device 101 according to a second embodiment. FIG. 2B is a plan view illustrating a layout of wiring layers 5A and 13A in the semiconductor device 101 shown in FIG. 2A. The semiconductor device 101 includes the wiring layers 5A and 13A instead of the wiring layers 5 and 13.

It is to be noted that, for ease of explanation and illustration, because other than the difference described above the semiconductor 101 has a configuration similar to the configuration of the semiconductor device 100 in the first embodiment, other components of the semiconductor device 101 are represented by identical numerals and the description thereof is omitted below.

In the configuration shown in FIGS. 2A and 2B, the width of the first wiring layer 5A is 10.0 μm and the width of the second wiring layer 13A is 10.0 μm. With reference to FIG. 2B, when viewed from above, the second wiring layer 13A is placed at a horizontal distance that is 2.00 μm or greater, for example 3.0 μm, from the first wiring layer 5A.

Although, similarly to the first embodiment, the first wiring layer 5A and the second wiring layer 13A are also formed in other areas that are not shown in the figures, in this embodiment, relative positions of the second wiring layer 13A to the first wiring layer 5A are not specified where the widths of the first wiring layer 5A and the second wiring layer 13A are less than 10.0 μm.

By contrast, with reference to FIGS. 2A and 2B, when the widths of the first wiring layer 5A and the second wiring layer 13A are 10.0 μm or greater, the second wiring layer 13A is placed at a horizontal distance that is 2.0 μm or greater, for example 3.0 μm, from the first wiring layer 5A.

With the above-described layout, therefore, even when the stress is generated in directions indicated by white arrows shown in FIG. 2A during manufacturing or while the semiconductor device 101 is in use, a heat stress exerted on the SOG film 9 located beneath the second wide wiring layer 13A can be reduced. Accordingly, cracks in the interlayer insulating films including the first interlayer insulating film 7, the SOG film 9, and the third interlayer insulating film 11 can be prevented.

Herein, TABLE 1 shows correlation between the distance between the first wiring layer 5(5A) and the second wiring layer 13(13A) and the occurrence of cracks. More specifically, custom-made semiconductor devices 100(101) were manufactured so that the first wiring layer 5(5A) and the second wiring layer 13(13A) were formed across a predetermined distance, and the semiconductor devices 100(101) were checked for cracks after the manufacturing process. It is to be noted that the first interlayer insulating film 7, the SOG film 9, and the third interlayer insulating film 11 were formed between the first wiring layer 5(5A) and the second wiring layer 13(13A).

TABLE 1

| WIDTH OF FIRST WIRING LAYER | DISTANCE BETWEEN FIRST WIRING LAYER AND SECOND WIRING LAYER | OCCURRENCE OF CRACKS AFTER MANUFACTURING PROCESS |
| --- | --- | --- |
| 21.0 μm | −1.0 μm | NO crack |
| 20.0 μm | 0 μm | crack OBSERVED |
| 19.5 μm | 0.5 μm | crack OBSERVED |
| 19.0 μm | 1.0 μm | NO crack |
| 18.5 μm | 1.5 μm | NO crack |
| 18.0 μm | 2.0 μm | NO crack |
| 16.0 μm | 3.0 μm | NO crack |
| 15.0 μm | 4.0 μm | NO crack |

In TABLE 1, a negative value (a value with "−") means the width with which the second wiring layer 13 overlaps the first wiring layer 5 horizontally (in the semiconductor device 100), and positive values mean the horizontal distance between the second wiring layer 13A and the first wiring layer 5A viewed from above (in the semiconductor device 101).

As shown in TABLE 1, when the distance between the first wiring layer 5(5A) and the second wiring layer 13(13A) is 0 μm and 0.5 μm, cracks are caused.

That is, when the second wiring layer 13 overlaps the first wiring layer 5 in a width of 1.0 μm or greater, the crack is not caused. Therefore, in the first embodiment, the second wiring layer 13 is deposited and etched above the first wiring layer 5 such that the width of the overlapping portion is 1.0 μm or greater.

On the other hand, when the second wiring layer 13A is at a horizontal distance 1.0 μm or greater from the first wiring layer 5A, the crack is not caused. Herein, when the second wiring layer 13A is disposed at a given horizontal distance from the first wiring layer 5A in the semiconductor device 101, it is preferable to consider influence of the stress and variations in the manufacturing. In particular, the stress is increased, compared with the semiconductor device 100 as the volume of the wiring layers becomes large. Therefore, in order to attain layout with a higher degree of versatility, the horizontal distance between the first wiring layer 5A and the second wiring layer 13A is set 2.0 μm or greater such that the width of margin is secured.

Turning now to FIGS. 3A through 3H, a method of manufacturing wiring layers and multiple films of the semiconductor device 100(101) including the SOG film 9 is described below.

Initially, as shown in FIG. 3A, the underlying insulating film 3 is deposited on the semiconductor substrate 1 on which semiconductor elements are formed. Then, a metal layer is deposited on the underlying insulating film 3 by physical vapor deposition (PVD) technique. Subsequently, the metal layer is patterned in accordance with circuit connection in the semiconductor 100 (or 101), by photolithography and etching, and thus, the first wiring layer 5(5A) is formed.

The first wiring layer 5(5A) has a laminated structure, for example, titanium (Ti)/aluminum (Al)/titanium nitride (TiN). The first wiring layer 5(5A) has a thickness ranging from 6000 Å to 9000 Å, for example. In the configuration shown in FIGS. 1A through 4, the thickness of the first wiring layer 5(5A) is 8000 Å.

As shown in FIG. 3B, the first interlayer insulating film 7 is deposited on the first wiring layer 5(5A) by plasma chemical vapor deposition (CVD) to a thickness of from 3500 Å to 4500 Å. The first interlayer insulating film 7 is made of a silicon oxide, for example.

As shown in FIG. 3C, the SOG film 9 is deposited on the entire surface of the first interlayer insulating film 7 by spin-coating. At this time, the SOG film 9, which has a relatively high degree of fluidity, eliminates or reduces the steps in the first interlayer insulating film 7 in portions where the height of the first interlayer insulating film 7 is reduced (concavities) due to the absence of the first wiring layer 5(5A) below, which achieves flattening of the interlayer insulating film 7 and the SOG film 9.

As shown in FIG. 3D, the SOG film 9 is removed by dry etching in the etch-back process and is retained only in the step portion of the first interlayer insulating 7 (concavities), and thus, the SOG film 9 is formed.

Subsequently, as shown in FIG. 3E, by plasma chemical vapor deposition (CVD), the third interlayer insulating film 11 is deposited on the first interlayer insulating film 7 and the SOG film 9 such that the thickness of the third interlayer insulating film 11 ranges from 3500 Å to 4500 Å, for example. With this arrangement, weakness in the SOG film 9 and moisture absorption by the SOG film 9 can be prevented. The third interlayer insulating film 11 is made of silicon oxide, for example.

Then, as shown in FIG. 3F, contact holes 15 are formed in predetermined areas in the first interlayer insulating film 7 and the third interlayer insulating film 11 located on the first wiring layer 5(5A) by photolithography and etching, so as to connect the first wiring layer 5(5A) and the second wiring layer 13(13A) electrically.

Subsequently, as shown in FIG. 3G, a metal layer is deposited on the third interlayer insulating film 11 and in the contact holes 15 by PVD.

Thereafter, as shown in FIG. 3H, the metal layer is patterned in accordance with the circuit connection in the semiconductor device 100(101) by photolithography and etching to form the second wiring layer 13(13A).

At this time, when the widths of the first wiring layer 5(5A) and the second wiring layer 13(13A) are 10.0 μm or greater, the wide second wiring layer 13 is placed so as to overlap the first wiring layer 5, such that the width of the overlapping portion is 1.0 μm or greater, as shown in FIGS. 1A and 1B. Alternatively, at this time, the wide second wiring layer 13A is placed at a horizontal distance that is 2.0 μm or greater from the first wiring layer 5A, as shown in FIGS. 2A and 2B.

With the above-described structure, heat stress on the SOG film 9 located beneath the second wide wiring layer 13(13A) can be reduced, and generating the crack in interlayer insulating films including the first interlayer insulating film 7, the SOG film 9, and the third interlayer insulating film 11 can be prevented.

It is to be noted that, although the layout of wiring layers of the semiconductor device according to embodiments are described, the present invention is not limited to those embodiments. Accordingly, various modifications and changes can be made without departing from the sprit and scope of the present invention.

For example, a single semiconductor device may include both a portion at which the wide second wiring layer 13 overlaps the first wiring layer 5 and a portion at which the wide second wiring layer 13A is placed at a horizontal distance from the first wiring layer 5A.

It is to be noted that, although the semiconductor device according to above-described embodiments includes two wiring layers, the present invention can be also applied to a semiconductor device that includes at least three wiring layers.

Figure 4:
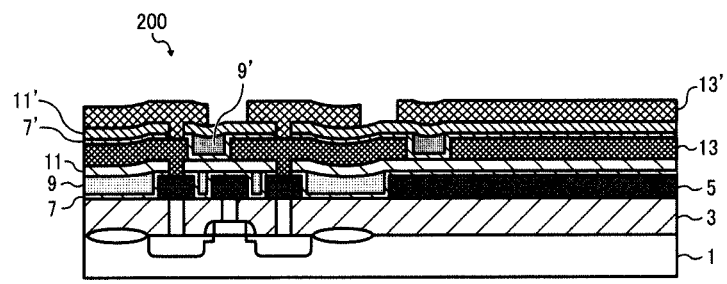
FIG. 4 is a schematic cross-sectional view illustrating positions of wiring layers of a semiconductor device according to another illustrative variation.
Figure 5:
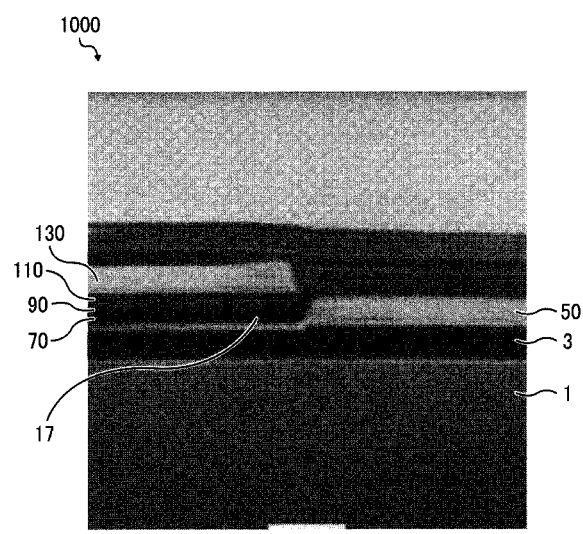
FIG. 5 is a cross-sectional view of a related art semiconductor device as viewed through an electronic microscope.
Figure 6A:
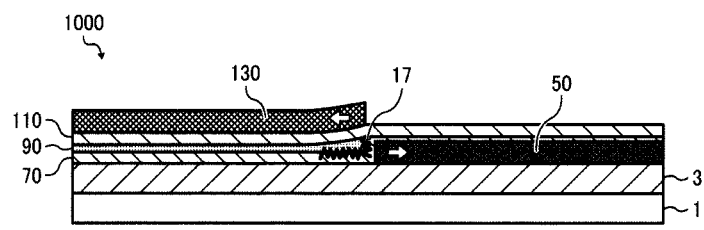
FIG. 6A is a schematic view of the semiconductor device according to FIG. 5.
Figure 6B:
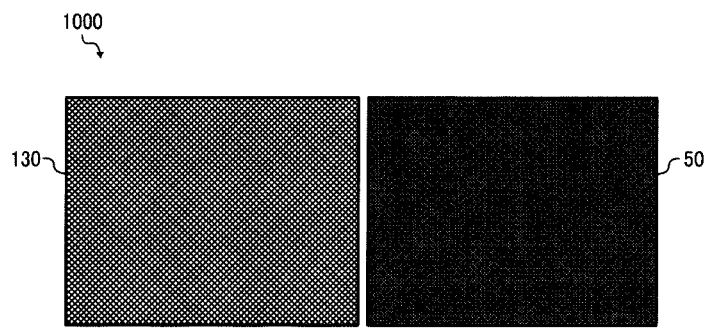
FIG. 6B is a plan view illustrating a layout of wiring layers in the semiconductor device shown in FIG. 5 and FIG. 6A.

More specifically, with reference to FIG. 4, a semiconductor device 200 includes at least one additional SOG film 9', at least one pair of interlayer insulating films 7' and 11' formed to surround one of the SOG films 9', and at least one additional wiring layer 13' formed on the upside film 11' in the pair of the interlayer insulating film 11'.

In this variation, at least one a vertically adjacent pair of wiring layers (13') among the at least one additional wiring layer 13' and the second wiring layer 13 has relative positions identical to the relative positions of the first wiring layer 5(5A) and the second wiring layer 13(13A).

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor device comprising:
an underlying insulating film formed on a semiconductor substrate;
a first wiring layer formed on a portion of the underlying insulating film;
a first interlayer insulating film formed on the underlying insulating film and the first wiring layer;
a second interlayer insulating film formed on concavities in the first interlayer insulating film by spin-coating and an etch-back process;
a third interlayer insulating film formed on the first interlayer insulating film and the second interlayer insulating film; and
a second wiring layer formed on the third interlayer insulating film,
wherein the first wiring layer and the second wiring layer have widths of 10.0 µm or greater, and
wherein an overlap portion where the first wiring layer and the second wiring layer overlap has an overlap width of 1.0 µm or greater, and
wherein the second wiring layer is disposed relative to the first wiring layer such that when a stress in a direction in which the first wiring layer and the second wiring layer pull away horizontally from each other is generated during manufacturing of the device, or while the device is in use, the first interlayer insulating film, the second interlayer insulating film and the third interlayer insulating film remain intact.

2. The semiconductor device according to claim 1, further comprising:
at least one additional interlayer insulating film formed through spin-coating and an etch-back process;
at least one pair of interlayer insulating films formed to surround said at least one additional interlayer insulating film formed through the spin-coating and the etch-hack process; and
at least one additional wiring layer formed on an upside film in said at least one pair of the interlayer insulating films,
wherein at least one vertically adjacent pair of wiring layers among said at least one additional wiring layer and the second wiring layer has relative positions identical to the relative positions of the first wiring layer and the second wiring layer.

3. A semiconductor device comprising:
an underlying insulating film formed on a semiconductor substrate;
a first wiring layer formed on the underlying insulating film;
a first interlayer insulating film formed on a portion of the underlying insulating film and the first wiring layer;
a second interlayer insulating film formed on concavities in the first interlayer insulating film by in-coating and an etch-back process;
a third interlayer insulating film formed on the first interlayer insulating film and the second interlayer insulating film; and
a second wiring layer formed on the third interlayer insulating film,
wherein the first wiring layer and the second wiring layer have widths of 10.0 µm or greater, and
wherein a horizontal gap between adjacent portions of the first wiring layer and the second wiring layer is 2.0 µm or greater, and
wherein the second wiring layer is disposed relative to the first wiring layer such that when a stress in a direction in which the first wiring layer and the second wiring layer pull away horizontally from each other is generated during manufacturing of the device, or while the device is in use, the first interlayer insulating film, the second interlayer insulating film and the third interlayer insulating film remain intact.

4. The semiconductor device according to claim 3, further comprising:
at least one additional interlayer insulating film formed through spin-coating and an etch-back process;
at least one pair of interlayer insulating films formed to surround said at least one additional interlayer insulating film formed through the spin-coating and the etch-back process; and
at least one additional wiring layer formed on an upside film in said at least one pair of the interlayer insulating films,
wherein at least one vertically adjacent pair of wiring layers among said at least one additional wiring layer and the second wiring layer has relative positions identical to the relative position of the first wiring layer and the second wiring layer.

* * * * *